United States Patent
Moriwaki et al.

(10) Patent No.: US 6,388,498 B1
(45) Date of Patent: May 14, 2002

(54) SEMICONDUCTOR DEVICE CAPABLE OF REDUCING NOISE

(75) Inventors: Shohei Moriwaki; Yoshifumi Azekawa; Osamu Chiba; Kazuhiro Shimakawa, all of Hyogo (JP)

(73) Assignees: Mitsubishi Denki Kabushiki Kaisha, Tokyo; Mitsubishi Electric System LSI Design Corporation, Hyogo, both of (JP)

(*) Notice: Subject to any disclaimer, the term of this patent is extended or adjusted under 35 U.S.C. 154(b) by 0 days.

(21) Appl. No.: 09/522,360

(22) Filed: Mar. 9, 2000

(30) Foreign Application Priority Data

Sep. 21, 1999  (JP) .............................. 11-267089

(51) Int. Cl.[7] .................................. H03L 5/00
(52) U.S. Cl. ...................... 327/333; 327/319
(58) Field of Search .............. 326/62, 63, 68, 326/80, 81; 327/112, 319, 333, 564, 565, 566

(56) References Cited

U.S. PATENT DOCUMENTS

| | | | | | |
|---|---|---|---|---|---|
| 3,217,181 A | * | 11/1965 | Zuk | ............................. | 326/80 |
| 4,723,082 A | * | 2/1988 | Asano et al. | ................... | 326/81 |
| 5,023,488 A | * | 6/1991 | Gunning | ........................ | 326/86 |
| 5,200,921 A | * | 4/1993 | Okajima | ........................ | 326/80 |
| 5,457,420 A | * | 10/1995 | Asada | .......................... | 326/81 |
| 5,510,748 A | * | 4/1996 | Erhart et al. | ................. | 327/530 |
| 5,808,480 A | * | 9/1998 | Morris | .......................... | 326/81 |
| 5,880,002 A | * | 3/1999 | Hutter et al. | ................ | 438/358 |
| 5,896,045 A | * | 4/1999 | Segel et al. | ..................... | 326/81 |
| 5,903,142 A | * | 5/1999 | Mann | .......................... | 323/313 |
| 5,923,187 A | * | 7/1999 | Maugars | ....................... | 326/86 |
| 6,043,699 A | * | 3/2000 | Shimizu | | |
| 6,087,881 A | * | 7/2000 | Chan et al. | ................... | 327/333 |
| 6,144,542 A | * | 11/2000 | Ker et al. | .................... | 361/111 |
| 6,218,895 B1 | * | 4/2001 | De et al. | ..................... | 327/566 |

FOREIGN PATENT DOCUMENTS

| | | |
|---|---|---|
| JP | 5-335492 | 12/1993 |
| JP | 7-58289 | 3/1995 |

* cited by examiner

*Primary Examiner*—Matthew Smith
*Assistant Examiner*—Paul Dinh
(74) *Attorney, Agent, or Firm*—McDermott, Will & Emery (57) ABSTRACT

A signal is transmitted to/from an analog circuit portion and a digital circuit portion through an interface circuit portion. Analog circuit portion, digital circuit portion and interface circuit portion are externally supplied with power from different power supplies and provided in different well regions.

17 Claims, 10 Drawing Sheets

SEMICONDUCTOR DEVICE CAPABLE OF REDUCING NOISE

BACKGROUND OF THE INVENTION

1. Field of the Invention

The present invention relates to semiconductor devices and, more specifically to a semiconductor device having a digital circuit and an analog circuit in one chip.

2. Description of the Background Art

Due to an advancement in the technical field of semiconductor devices, it is becoming a common practice to integrate two types of circuits, respectively processing analog and digital signals, in one chip. Therefore, well regions for digital and analog circuits are separated to be externally supplied with power from different power supplies to avoid interference by noise.

Figure 10:
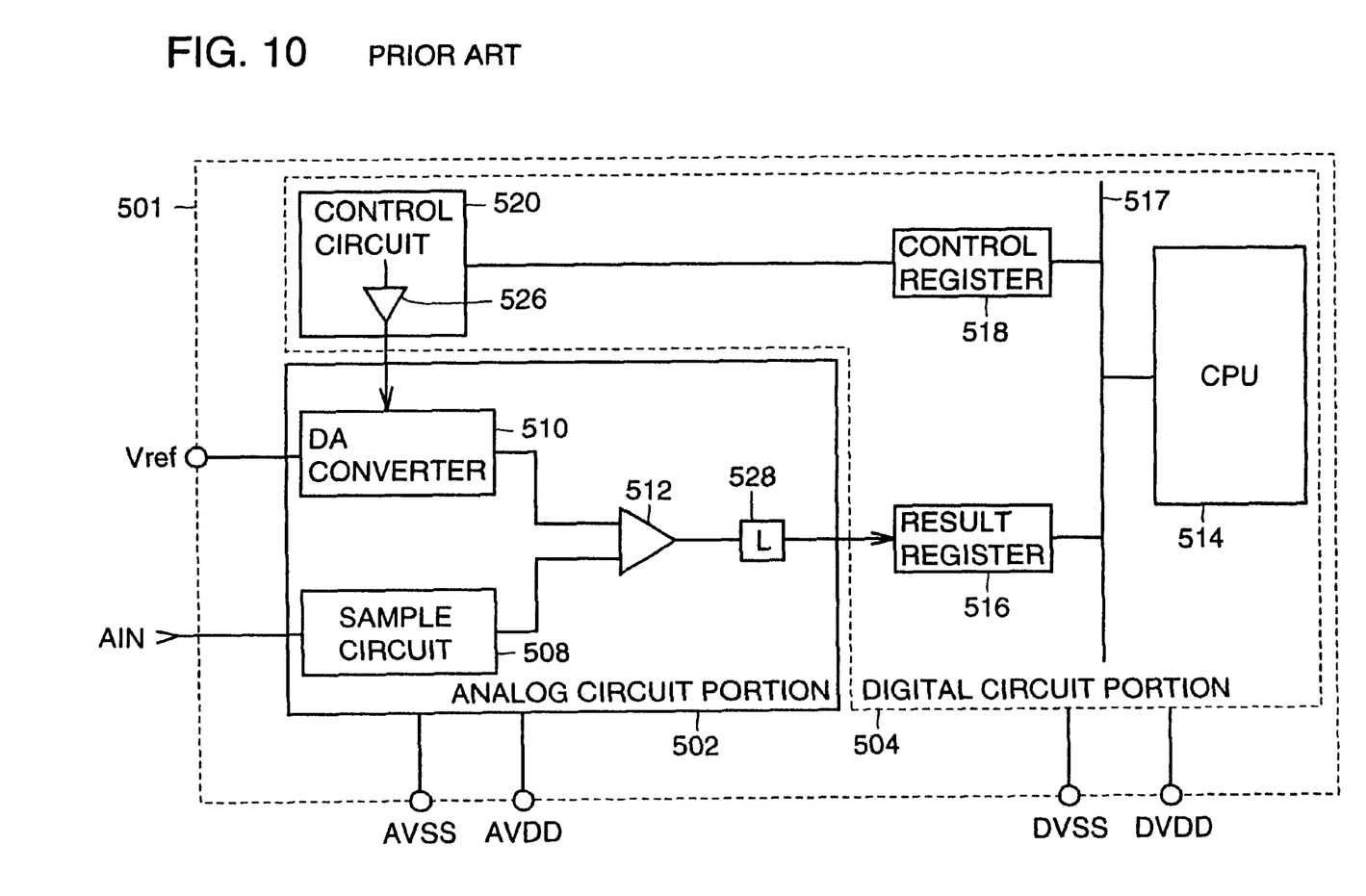
FIG. 10 is a schematic block diagram showing a structure of a conventional semiconductor device 501 having an analog circuit and a digital circuit.

FIG. 10 is as schematic block diagram showing a structure of a conventional semiconductor device 501 having an analog circuit and a digital circuit.

Referring to FIG. 10, semiconductor device 501 includes an analog circuit portion 502 externally receiving an analog input signal for process, and a digital circuit portion 504 receiving data from the analog circuit portion for a prescribed operation and feeding back the operation result to the analog circuit portion.

Analog circuit portion 502 includes a sample circuit 508 receiving and sample-holding an analog input signal AIN and performing a sample-and-hold operation thereon, a DA converter 510 converting a digital signal from the digital circuit portion to an analog signal, a comparator 512 comparing outputs from sample circuit 508 and DA converter 510, and a latch circuit 528 latching an output from comparator 512.

Digital circuit portion 504 includes a result register 516 receiving and storing an output from latch circuit 528, a CPU (Central Processing Unit) 514 outputting an instruction signal for a control in accordance with a content of the result register, a control register 518 holding the instruction signal output from CPU 514, and a control circuit 520 for a process in accordance with a content of control register 518.

Control circuit 520 outputs a control signal to DA converter 510 included in analog circuit portion 502. Control circuit 520 includes a buffer circuit 526 outputting the control signal at its outputting portion.

An analog power supply potential AVDD and an analog ground potential AVSS are externally applied to analog circuit portion 502. A digital power supply potential DVDD and a digital ground potential DVSS are applied to digital circuit portion 504. Namely, the power supply potentials are externally applied to the analog and digital circuit portions separately.

Figure 11:
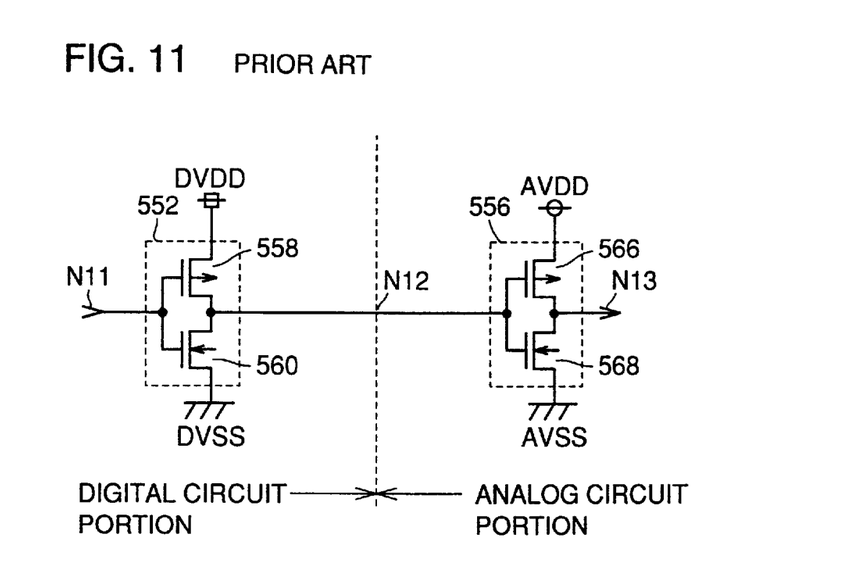
FIG. 11 is a circuit diagram shown in conjunction with a connection between an output stage of buffer circuit 526 and an input stage of DA converter 510 in FIG. 10.

FIG. 11 is a circuit diagram shown in conjunction with a connecting portion between an output stage of buffer circuit 526 and an input stage of DA converter 510 in FIG. 10.

Referring to FIG. 11, an output portion of buffer circuit 526 in FIG. 10 includes an inverter 552. An input portion of DA converter 510 includes an inverter 556.

Inverter 552 includes a P channel MOS transistor 558 and an N channel MOS transistor 560 having their gates connected to an input node N11 and connected in series between a node supplied with digital power supply potential DVDD and a node supplied with digital ground potential DVSS. A connection node between P channel MOS transistor 558 and N channel MOS transistor 560 is a node N12.

Inverter 556 includes a P channel MOS transistor 566 and an N channel MOS transistor 568 having their gates connected to node N12 and connected in series between a node supplied with analog power supply potential AVDD and a node supplied with analog ground potential AVSS. A connection node between P channel MOS transistor 566 and N channel MOS transistor 568 is a node N13.

Figure 12:
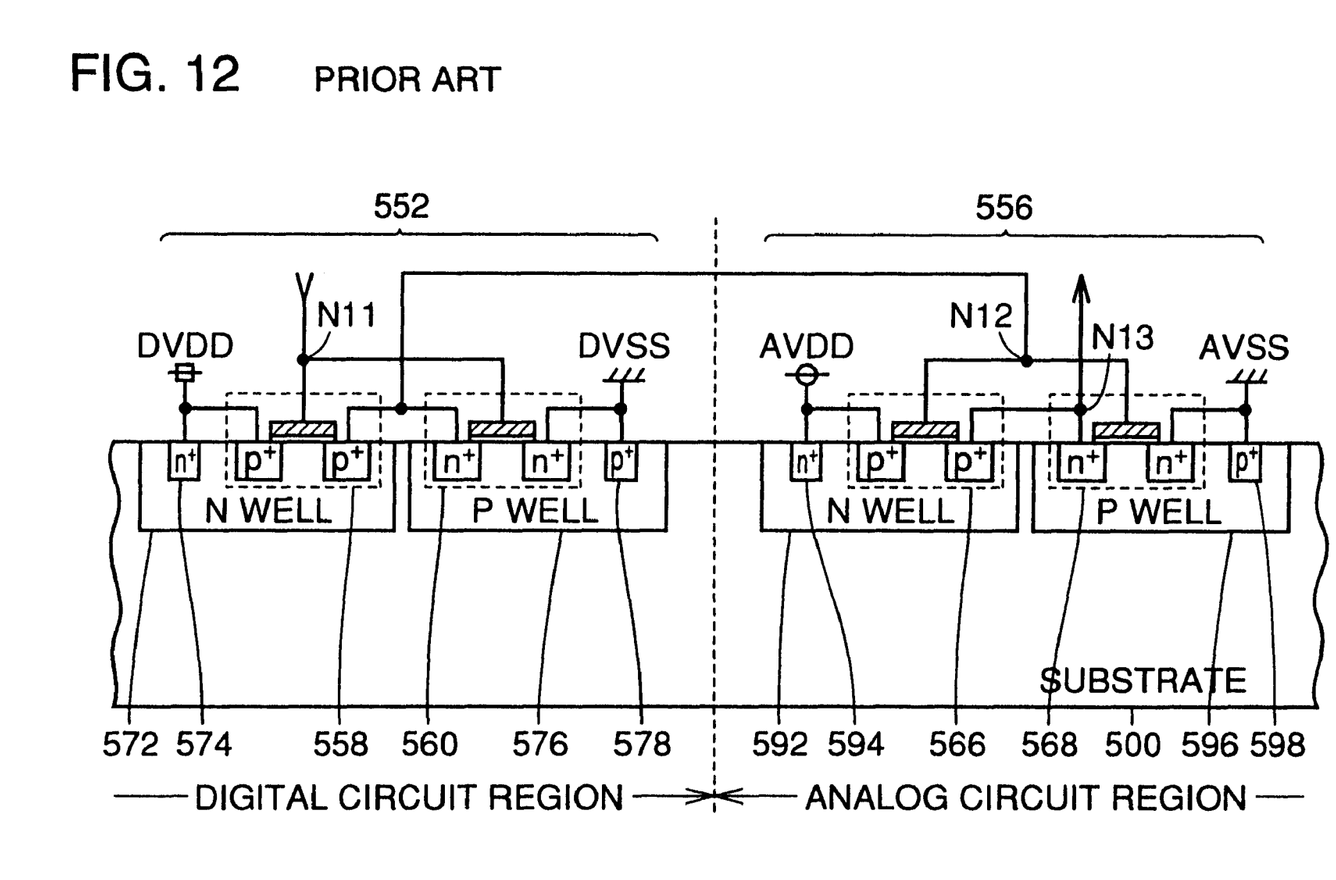
FIG. 12 is a cross sectional view showing a structure of the semiconductor substrate at the connecting portion shown in FIG. 11.

FIG. 12 is a cross sectional view showing a structure of a semiconductor substrate at the connecting portion shown in FIG. 11.

Referring to FIGS. 11 and 12, inverters 552 and 556 are respectively formed in digital and analog circuit regions. In the digital circuit region, N and P wells 572 and 576 are formed in a main surface of a substrate 500. P channel MOS transistor 558 and an N type impurity region 574 are formed in N well 572. N type impurity region 574 and a source of P channel MOS transistor 558 are both connected to digital power supply potential DVDD.

N channel MOS transistor 560 and a P type impurity region 578 are formed in P well 576. A source of N channel MOS transistor 560 and P type impurity region 578 are both connected to digital ground potential DVSS.

In the analog circuit region, N and P wells 592 and 596 are formed in the main surface of substrate 500. P channel MOS transistor 566 and an N type impurity region 594 are formed in N well 592. A source of P channel MOS transistor 566 and N type impurity region 594 are both connected to analog power supply potential AVDD.

N channel MOS transistor 568 and a P type impurity region 598 are formed in P well 596. A source of N channel MOS transistor 568 and P type impurity region 598 are both connected to analog ground potential AVSS.

As is apparent from the cross sectional structure, in the conventional semiconductor device, wells respectively formed for the elements of digital and analog circuits are separated and supplied with different power supply potentials. Thus, interference by noise is not caused by the circuits.

However, as the interface portion for transmitting a signal and from the digital and analog circuits is arranged in one of the wells of analog and digital circuit regions, the noise may disadvantageously be propagated through the interface circuit.

Figure 13:
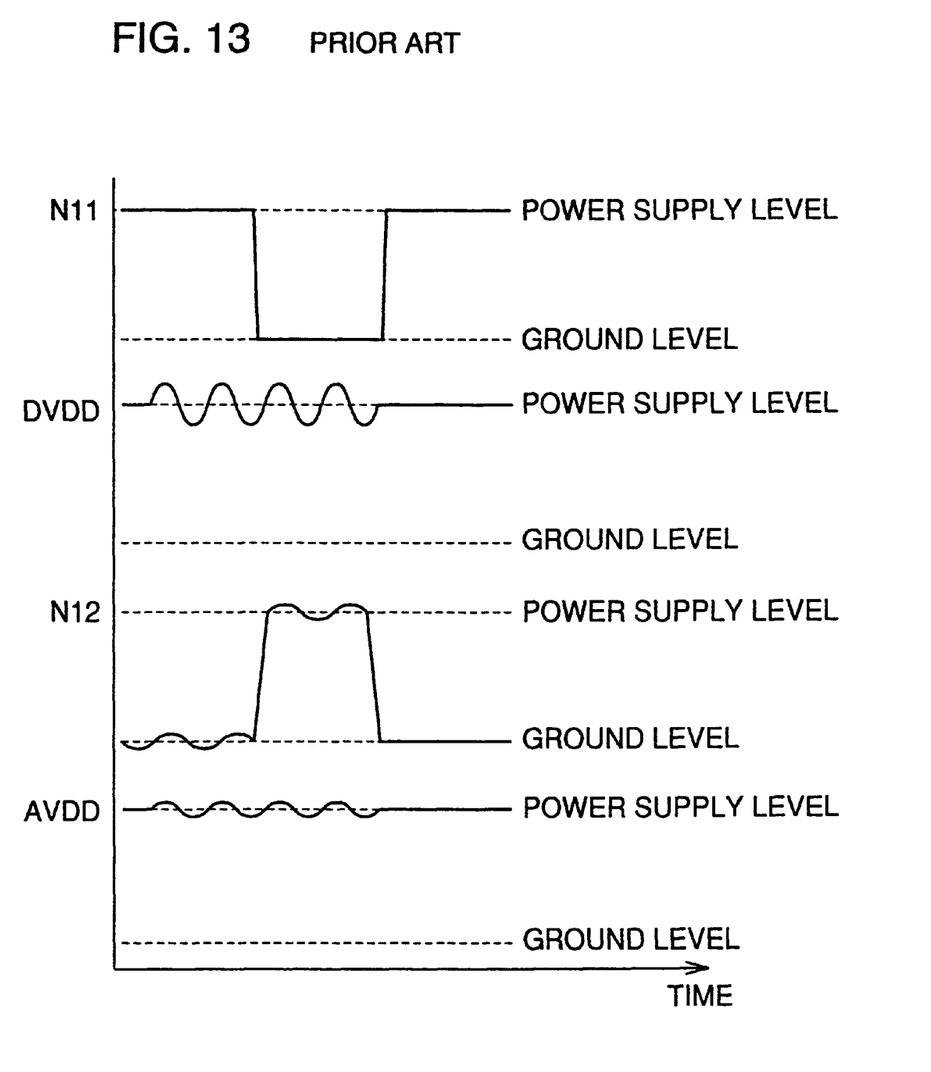
FIG. 13 is a schematic diagram showing waveforms in conjunction with propagation of noise.

FIG. 13 is a schematic diagram showing waveforms in conjunction with propagation of noise.

Referring to FIGS. 12 and 13, when a potential of node N11 falls from an H to L level, P channel MOS transistor 558 is rendered conductive and N channel MOS transistor 560 is brought into a non-conductive state. Responsively, node N12 rises from the L to H level. At the time, power supply noise is caused to digital power supply potential DVDD due to noise caused by switching the MOS transistor or the like.

Then, noise is also superimposed on the signal output from the circuit which is supplied with digital power supply potential DVDD as a power supply potential. Therefore, the waveform at node N12 is also affected by the noise. The waveform affected by the noise controls conductivities of P and N channel MOS transistors 566 and 568. As a result, analog power supply potential AVDD is also affected by the noise caused to the digital power supply potential.

Noise is most likely to be generated around the output buffer and clock to an external portion in the digital portion. The generated noise is propagated to the analog portion while being superimposed on the power supply and the signal line. For example, an AD converter converting an analog signal of 5 volts to a digital signal of 10 bits is affected considerably by noise as it operates at a resolution of 5 volts divided by 1024, that is, at 5 mV.

Noise from the analog portion to the digital portion is the noise that has been superimposed on an analog signal input or generated during operation of an operational amplifier in the analog portion. Recently, while not as low as an operating power supply voltage of the analog circuit, the operating power supply voltage of the digital circuit is becoming lower and the operation is considerably affected by noise.

Thus, unless interference of analog and digital circuits by noise is reduced, a desired high performance is not obtained and malfunction is caused.

SUMMARY OF THE INVENTION

An object of the present invention is to provide a semiconductor device preventing interference of analog and digital circuits and reducing a level of noise.

In short, the present invention is a semiconductor device including a single semiconductor chip. The semiconductor device is provided with first, second and third high potential power supply terminals, first, second and third low potential power supply terminals, first and second internal circuits, and an interface circuit.

The first, second and third high potential power supply terminals are formed on the semiconductor chip and receive power supply voltages through the lead frame. The first, second and third low potential power supply terminals are formed on the semiconductor chip and receive power supply voltages respectively lower than those of the first, second and third high potential power supply terminals through the lead frame. The first internal circuit is supplied with operating power supply voltages from the first high potential power supply terminal and the first low potential power supply terminal. The second internal circuit is supplied with operating power supply voltages from the second high potential power supply terminal and the second low potential power supply terminal. The interface circuit is supplied with operating power supply voltages from the third high potential power supply terminal and the third low potential power supply terminal and the transmits the signal between the first and second internal circuits.

According to another aspect of the present invention, a semiconductor device is formed in a surface of a semiconductor substrate and includes a first internal circuit, a second internal circuit, and an interface circuit. The first internal circuit is formed in a first region of the main surface of the semiconductor substrate and includes a first N channel MOS transistor and a first P channel MOS transistor. The second internal circuit is formed in the second region of the main surface of the semiconductor substrate and includes a second N channel MOS transistor and a second P channel MOS transistor. The interface circuit is formed in an interface circuit region of the main surface of the semiconductor substrate, includes a third N channel MOS transistor and a third P channel MOS transistor, and transmits a signal between the first and second internal circuits. The first region includes a first N well for the first P channel MOS transistor and a first P well for the first N channel MOS transistor. The second region includes a second N well for the second P channel MOS transistor and a second P well for the second N channel MOS transistor. The interface circuit region includes a third N well for the third P channel MOS transistor and a third P well for the third N channel MOS transistor.

Therefore, a main effect of the present invention is that noise is not propagated between the internal circuits and noise superimposed on a signal transmitted between the internal circuits is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in detail with reference to the drawings. It is noted that the corresponding portions are denoted by the same reference numerals.

Figure 1:
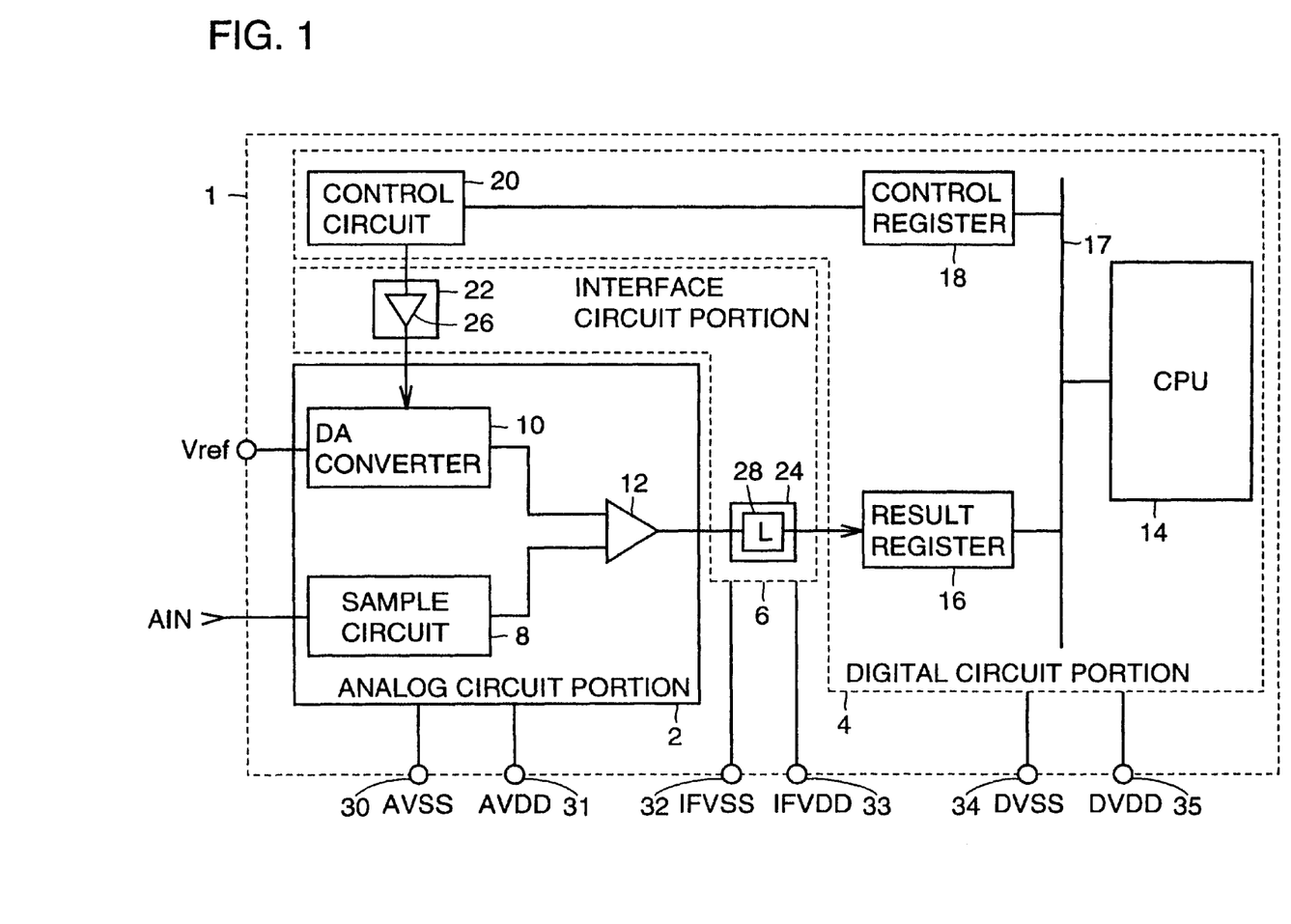
FIG. 1 is a schematic block diagram showing a structure of a semiconductor device 1 according to a first embodiment of the present invention.

Referring to FIG. 1, a semiconductor device of the first embodiment includes: an analog circuit portion 2 externally receiving an analog input signal AIN for process; a digital circuit portion 4 for feeding back a prescribed control signal to analog circuit portion 2 based on a result obtained from the analog circuit portion; and an interface circuit portion 6 for transmitting/receiving a signal to/from analog circuit portion 2 and digital circuit portion 4.

Analog circuit portion 2 includes: a sample circuit 8 receiving analog input signal AIN for a sample-and-hold operation; a DA converter 10 receiving an externally applied reference potential Vref and performing a DA conversion on the control signal applied from the interface circuit portion for output; and a comparator 12 comparing outputs from DA converter 10 and sample circuit 8.

Interface circuit portion 6 includes a transmitting portion 24 receiving an output from comparator 12 and transmitting the result to the digital circuit portion, and the transmitting portion 22 receiving the control signal from the digital circuit portion and applying it to DA converter 10. Transmitting portion 24 includes a latch circuit 28 latching the output from comparator 12. Transmitting portion 22 includes a buffer circuit 26 amplifying and outputting the control signal output from the digital circuit portion to DA converter 10.

Digital circuit portion 4 includes: a result register 16 receiving the signal latched by latch circuit 28; a CPU 14 performing a prescribed operation in accordance with a content of result register 16; a control register 18 holding the result obtained from CPU 14; and a control circuit 20 outputting a control signal in accordance with the content of control register 18. Result register 16, CPU 14, and control register 18 are connected by a bus 17.

Semiconductor device 1 further includes power supply terminals 30 to 35 provided on a chip respectively receiving an analog power supply potential AVDD, analog ground potential AVSS, power supply potential IFVDD for interface, ground potential IFVSS for interface, digital power supply potential DVDD and digital ground potential DVSS, which are externally applied through a lead frame.

Analog power supply potential AVDD and analog ground potential AVSS are applied to analog circuit portion 2. Digital power supply potential DVDD and digital ground potential DVSS are applied to digital circuit portion 4. Power supply potential IFVDD for interface and ground potential IFVSS for interface are applied to interface circuit portion 6. These power supply potentials are independently applied to respective circuit portions through power supply terminals 30 to 35.

Figure 2:
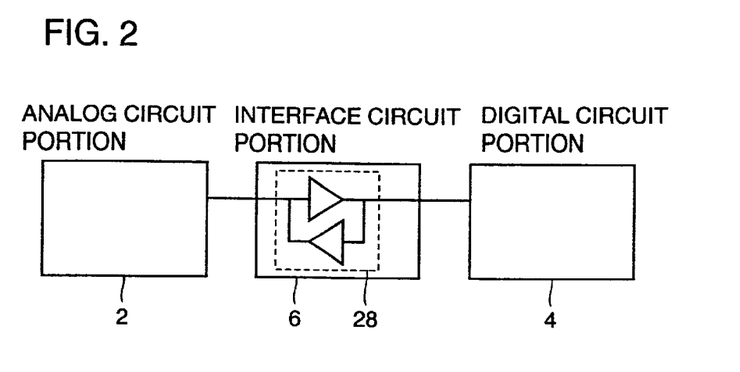
FIG. 2 is a schematic diagram showing semiconductor device 1 of the first embodiment.

Referring to FIG. 2, a signal output from analog circuit portion 2 is latched by latch circuit 28 in interface circuit portion 6 and transmitted to digital circuit portion 4.

Figure 3:
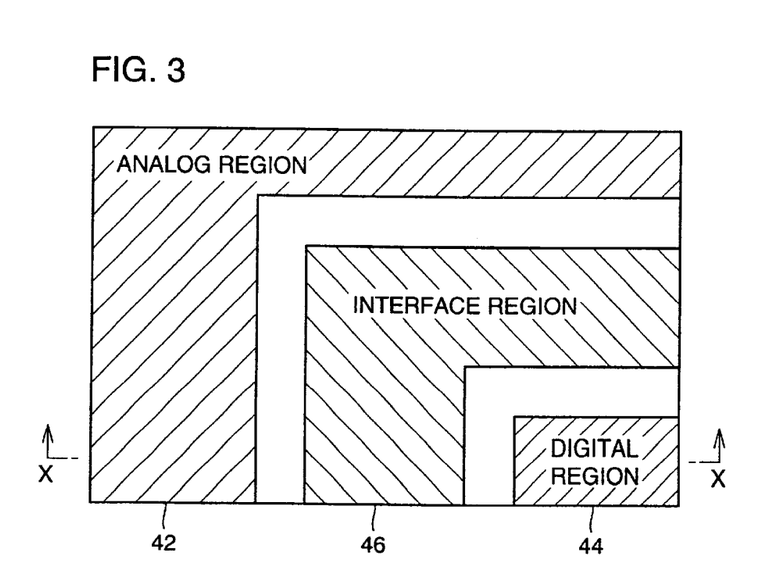
FIG. 3 is a plan view corresponding to FIG. 2.

Referring to FIGS. 2 and 3, an analog region for analog circuit portion 2, an interface region 46 for the interface circuit portion, and a digital region 44 for digital circuit portion 4 are separated.

Figure 4:
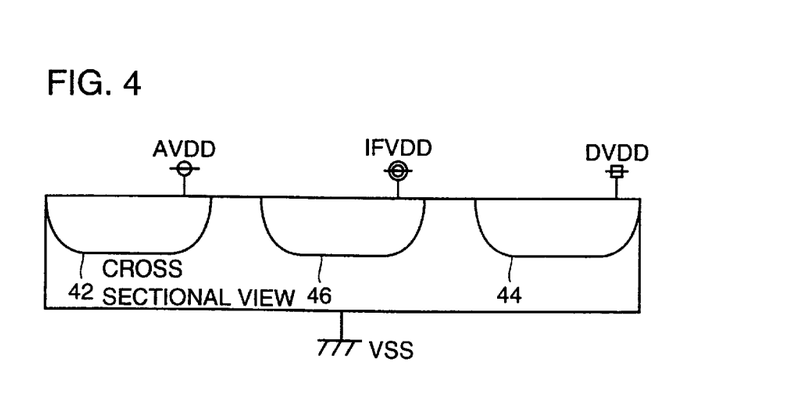
FIG. 4 is a diagram taken along the line X—X in FIG. 3.

Referring to FIG. 4, analog power supply potential AVDD is applied to analog circuit portion 42, power supply potential IFVDD for interface is applied to interface region 46, and digital power supply potential DVDD is applied to digital region 44. Thus, the analog and digital circuit portions are separated to be externally supplied with different power supply potentials. In addition, to reduce the influence of noise when a signal is transmitted between the analog and digital circuit portions, interface circuit portion 6 is also provided in a separate region and supplied with a different power supply potential.

Figure 5:
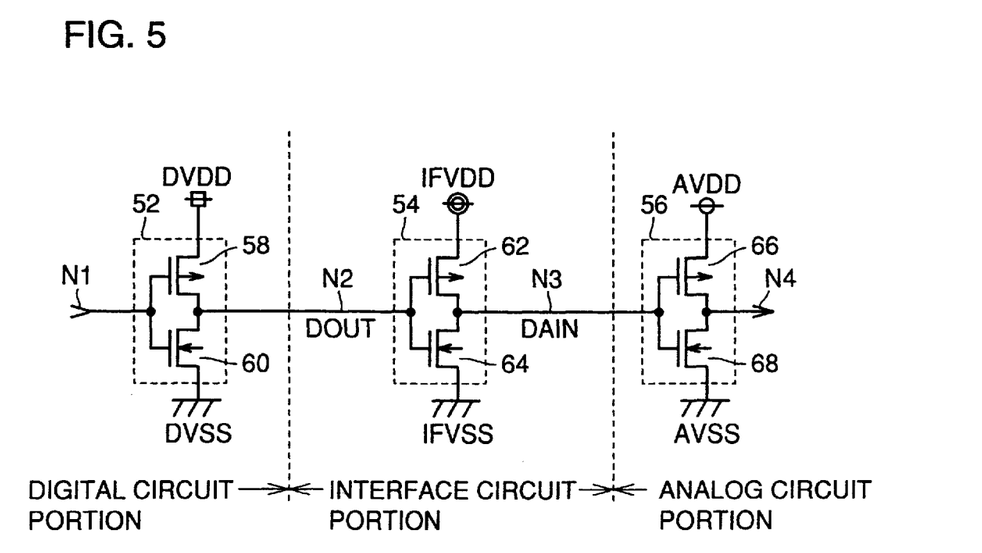
FIG. 5 is a circuit diagram showing a portion transmitting a signal from a control circuit 20 to a DA converter 10 in FIG. 1.

Referring to FIGS. 1 and 5, an inverter 52 is provided in an output portion of control circuit 20. An inverter 54 is provided in the interface circuit portion which receives an output from inverter 52 and transmits it to the analog circuit portion. An inverter 56 is provided in an input portion of DA converter 10 in the analog circuit portion which receives an output from inverter 54.

Inverter 52 includes: a p channel MOS transistor 58 having its gate, source and drain respectively connected to a node N1, digital power supply potential DVDD and node N2; and an N channel MOS transistor 60 having its source, drain and gate respectively connected to digital ground potential DVSS, node N2 and node N1. Inverter 54 includes: a P channel MOS transistor 62 having its gate, source and drain respectively connected to node N2, power supply potential IFVDD for interface and node N3; and an N channel MOS transistor 64 having its gate, drain and source respectively connected to node N2, node N3 and ground potential IFVSS for interface.

Inverter 56 includes: a P channel MOS transistor 66 having its gate, source and drain respectively connected to node N3, analog power supply potential AVDD and node N4; and an N channel MOS transistor 68 having its gate, drain and source respectively connected to node N3, node N4 and analog ground potential AVSS.

Inverter 54 in the interface circuit receives a signal DOUT output from the digital circuit portion and transmits a signal DAIN to the DA converter in the analog circuit portion.

Figure 6:
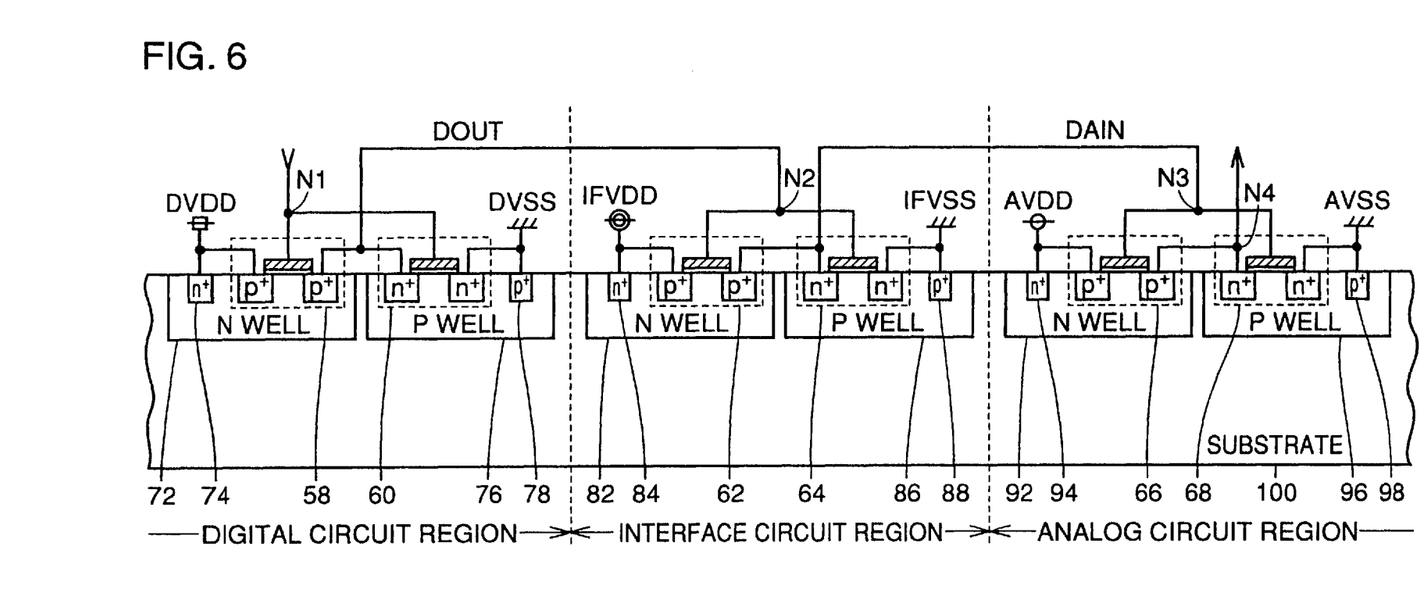
FIG. 6 is a cross sectional view showing a semiconductor substrate in which the circuit shown in FIG. 5 is formed.

Referring to FIGS. 5 and 6, an N well 72 and a P well 76 are formed in the main surface of a substrate 100 in the digital circuit region. P channel MOS transistor 58 and an N type impurity region 74 are formed in N well 72. A source of P channel MOS transistor 58 and N type impurity region 74 are both connected to digital power supply potential DVDD.

N channel MOS transistor 60 and a P type impurity region 78 are formed in P well 76. P type impurity region 78 and a source of N channel MOS transistor 60 are both connected to digital ground potential DVSS.

An N well 82 and a P well 86 are formed in the interface circuit region of substrate 100. An N type impurity region 84 and P channel MOS transistor 62 are formed in N well 82. N type impurity region 84 and a source of P channel MOS transistor 62 are both connected to power supply potential IFVDD for interface. A P type impurity region 88 and N channel MOS transistor 64 are formed in P well 86. P type impurity region 88 and a source of N channel MOS transistor 64 are both connected to ground potential IFVSS for interface.

An N well 92 and a P well 96 are formed in the main surface of substrate 100 in the analog circuit region. An N type impurity region 94 and P channel MOS transistor 66 are formed in N well 92. N type impurity region 94 and a source of P channel MOS transistor 66 are both connected to analog power supply potential AVDD.

A P type impurity region 98 and N channel MOS transistor 68 are formed in P well 96. P type impurity region 98 and a source of N channel MOS transistor 68 are both connected to analog ground potential AVSS.

The connections of the transistors are as shown in FIG. 5, and therefore description thereof will not be repeated.

Figure 7:
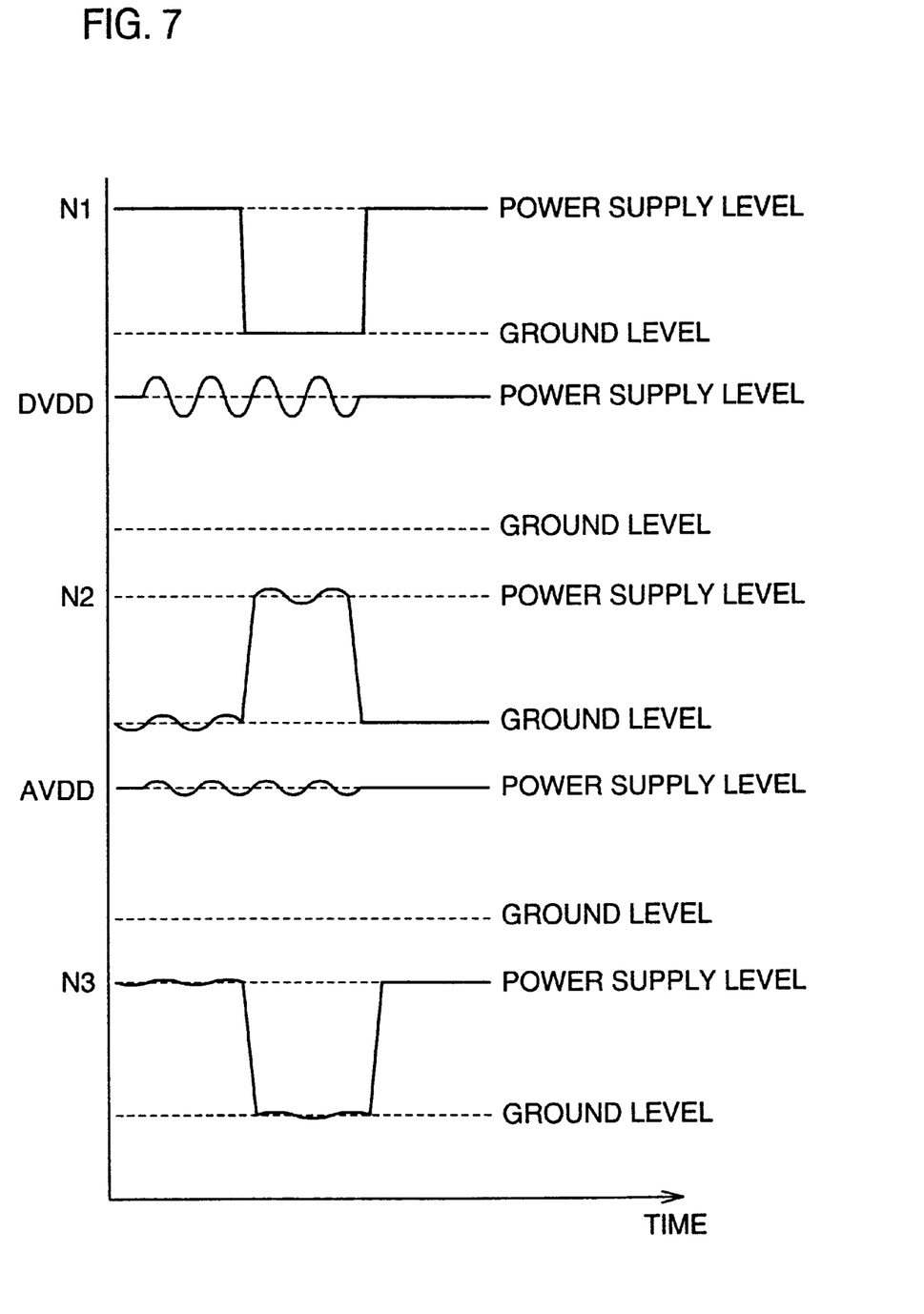
FIG. 7 is a diagram showing waveforms in conjunction with the influence of noise in the first embodiment.

Referring to FIGS. 6 and 7, when a signal waveform applied to node N1 falls, noise is caused to digital power supply potential DVDD due to switching of MOS transistors 58 and 60 or the like. Responsively, node N2, to which output signal DOUT to the interface circuit portion is applied, is also affected by the noise. In addition, power supply potential IFVDD for interface is more or less affected by the noise. However, the level of the noise caused to power supply potential IFVDD for interface is lower than that caused to digital power supply potential DVDD. Therefore, a level of noise caused to node N3 to which a signal DAIN output from the interface circuit portion is applied is lower than that caused to the control signal conventionally received by the analog circuit portion.

As described above, a region for the interface circuit is provided between regions for the digital and analog circuits. Then, power supply potentials are externally applied separately to respective wells for the transistors and the like in these regions. Thus, the noise from the analog circuit to the digital circuit or that from the digital circuit to the analog circuit, which would mainly be propagated through a power supply line, is prevented.

In addition, noise on the signal line between the analog and digital circuits can be reduced as it is propagated through the independent well and the interface circuit formed in the well.

Figure 8:
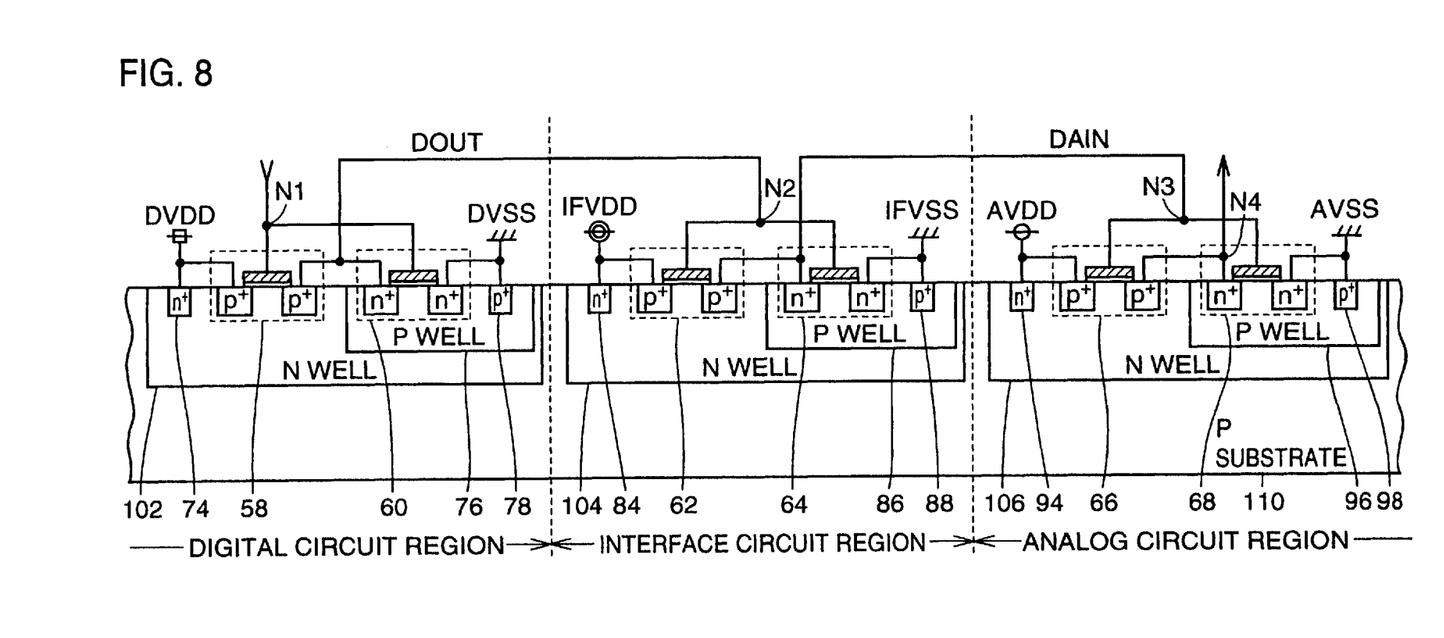
FIG. 8 is a cross sectional view showing a modification of the structure shown in FIG. 6.

Referring to FIG. 8, the structure is different from that shown in FIG. 6 in that a P substrate 110 is used in place of substrate 100 and that the structure is provided with N wells 102, 104 and 106 in place of N wells 72, 82 and 92. Depths of N wells 102, 104 and 106 are respectively larger than those of P wells 76, 86 and 96. P wells 76, 86 and 96 are respectively formed in N wells 102, 104 and 106.

The other parts of structure are the same as those shown in FIG. 6, and therefore description thereof will not be repeated.

By providing such N wells surrounding P wells and making them independent as the digital circuit portion, interface circuit portion and analog circuit portion, further reduction in noise between the digital and analog circuits is achieved. More preferably, a so-called triple well structure may be used in which an N well having a small depth for a P channel MOS transistor is formed in an N well having a large depth.

Second Embodiment

Figure 9:
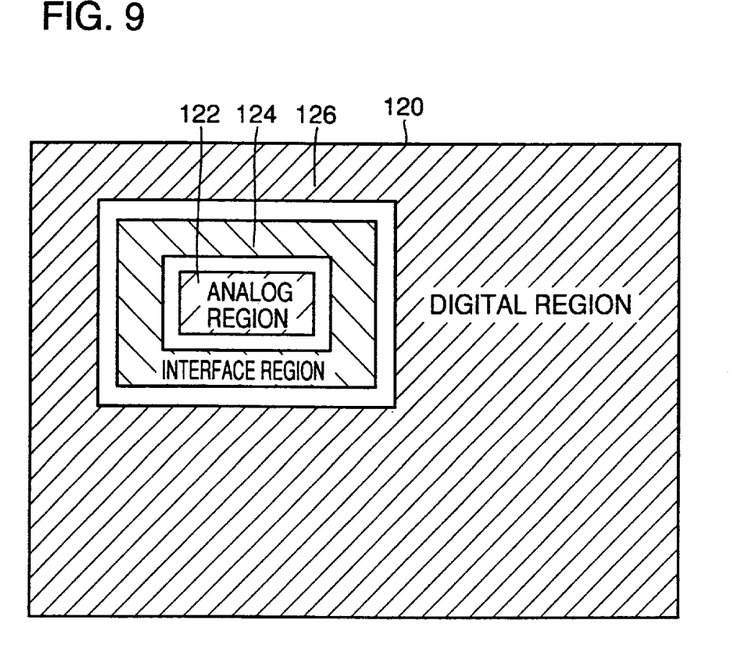
FIG. 9 is a plan view showing an arrangement of an analog region and a digital region in a second embodiment.

Referring to FIG. 9, an interface region 124 is provided in a main surface of a substrate 120 to surround a region 122 in which an analog circuit is arranged. A digital region in which a digital circuit is to be formed is provided outside interface region 124.

Wells for analog and digital circuits are respectively formed in analog and digital regions 122 and 126. These are separated by interface region 124. The regions are externally supplied with different power supply potentials, and therefore potentials of the wells for the analog and digital circuits do not interfere with each other.

As in the case of the first embodiment, a signal transmitted from a circuit in the well for the analog circuit to the circuit formed in the well for the digital circuit is propagated through a circuit formed in interface region 124. On the other hand, noise from the circuit formed in the analog region for the analog circuit is propagated to the digital circuit formed in digital region 126 through the circuit formed in interface region 124. At the time, noise is reduced by the interface circuit.

As described above, in the second embodiment, the region for the interface circuit is arranged to surround the region for the analog circuit. Further, the region for the digital circuit is formed outside the region for the interface circuit.

Therefore, noise is prevented from being transmitted from the analog power supply to the digital power supply, or from a digital power supply to the analog power supply. In addition, noise superimposed on the signal transmitted between the digital circuit and the analog circuit is reduced by the interface circuit.

In the embodiment shown in FIG. 9, the interface circuit is formed to surround the analog circuit. Alternatively, the interface circuit may be formed to surround the digital circuit to produce a similar effect.

Further, in each of the first and second embodiments, noise due to interference is reduced when the analog and digital circuits are integrated in one chip. Even when a plurality of analog circuits are integrated, if a signal is transmitted between the analog circuits, separation of power supplies for the interface circuits such as buffers effectively reduces noise. In addition, even when a plurality of digital circuits are integrated, if a signal is transmitted between the digital circuits, separation of power supplies for the interface circuits such as buffers effectively reduces noise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including one semiconductor chip, comprising:

first, second and third high potential power supply terminals formed on said semiconductor chip and receiving power supply voltages applied from an exterior to the semiconductor chip;

first, second and third low potential power supply terminals formed on said semiconductor chip and receiving power supply potentials respectively lower than potentials of said first, second and third high potential power supply terminals applied from an exterior to the semiconductor chip;

a first internal circuit supplied with operating power supply voltages from said first high potential power supply terminal and said first low potential power supply terminal;

a second internal circuit supplied with operating power supply voltages from said second high potential power supply terminal and said second low potential power supply terminal; and an interface circuit supplied with operating power supply voltages from said third high potential power supply terminal and said third low potential power supply terminal, receiving a first signal from said first internal circuit and outputting a second signal to said second internal circuit, said second signal being a digital signal having a high level and a low level respectively corresponding to the potentials received by said third high and low potential power supply terminals.

2. The semiconductor device according to claim 1, wherein said first signal is a digital signal having a high level and a low level respectively corresponding to said first high and low potentials.

3. A semiconductor device formed in a main surface of a semiconductor substrate, comprising:

a first internal circuit formed in a first region of said main surface of said semiconductor substrate and including a first N channel MOS transistor and a first P channel MOS transistor;

a second internal circuit formed in a second region of said main surface of said semiconductor substrate and including a second N channel MOS transistor and a second P channel MOS transistor; and an interface circuit formed in an interface circuit region of said main surface of said semiconductor substrate, including a third N channel MOS transistor and a third P channel MOS transistor, and transmitting a signal between said first internal circuit and said second internal circuit, said first region including a first N well for said first P channel MOS transistor, and a first P well for said first N channel MOS transistor, said second region including a second N well for said second P channel MOS transistor, and a second P well for said second N channel MOS transistor, and said interface circuit region including a third N well for said third P channel MOS transistor, and a third P well for said third N channel MOS transistor.

4. The semiconductor device according to claim 3, wherein said first internal circuit includes an analog circuit processing an analog signal, and said second internal circuit includes a digital circuit processing a digital signal.

5. The semiconductor device according to claim 4, wherein said interface circuit includes an inverter circuit receiving, inverting and amplifying said signal for output.

6. The semiconductor device according to claim 4, wherein said interface circuit includes a buffer circuit receiving and amplifying said signal for output.

7. A semiconductor device according to claim 4, wherein said interface circuit includes a latch circuit receiving and holding said signal.

8. The semiconductor device according to claim 4, wherein said analog circuit includes a DA converter.

9. The semiconductor device according to claim 8, wherein a digital signal to be converted into an analog circuit is applied to said DA converter through said third internal circuit by said second internal circuit.

10. The semiconductor device according to claim 4, wherein said analog circuit includes a comparing circuit comparing levels of two analog signals.

11. The semiconductor device according to claim 10, wherein said comparing circuit supplies a comparison result to said second internal circuit through said third internal circuit.

12. The semiconductor device according to claim 4, wherein said analog circuit includes a sample circuit sampling and holding a level of the analog signal.

13. The semiconductor device according to claim 4, wherein said digital circuit includes a central processing unit controlling said analog circuit.

14. The semiconductor device according to claim 3, wherein said semiconductor substrate is of a P type, said first, second and third N wells have depths respectively larger than those of said first, second and third P wells, and said first, second and third P wells are respectively formed in said first, second and third N wells.

15. The semiconductor device according to claim 3, wherein said second region is provided in said main surface to surround said first region with a space, and said interface circuit region is provided in said space between said first and second regions to surround said first region in said main surface.

16. The semiconductor device according claim 3, further comprising:
    first to third high potential power supply terminals formed on a semiconductor chip on which said semiconductor device is formed, and receiving power supply voltages applied from an exterior to the semiconductor chip; and
    first to third low potential power supply terminals formed on the semiconductor chip on which said semiconductor device is formed, and receiving power supply voltages applied from an exterior to the semiconductor chip, wherein:
        the power supply voltages from said first high potential power supply terminal and said first low potential power supply terminal are supplied to said first internal circuit for operation,
        the power supply voltages from said second high potential power supply terminal and said second low potential power supply terminal are supplied to said second internal circuit for operation, and
        the power supply voltages from said third high potential power supply terminal and said third low potential power supply terminal are supplied to said third internal circuit for operation.

17. A semiconductor device including one semiconductor chip, comprising:
    first, second and third high potential power supply terminals formed on said semiconductor chip and receiving power supply voltages applied from an exterior to the semiconductor chip;
    first, second and third low potential power supply terminals formed on said semiconductor chip and receiving power supply potentials respectively lower than potentials of said first, second and third high potential power supply terminals applied from an exterior to the semiconductor chip;
    a first internal circuit supplied with operating power supply voltages from said first high potential power supply terminal and said first low potential power supply terminal;
    a second internal circuit supplied with operating power supply voltages from said second high potential power supply terminal and said second low potential power supply terminal; and
    an interface circuit supplied with operating power supply voltages from said third high potential power supply terminal and said third low potential power supply terminal, said interface circuit including a first transmission portion receiving a first signal from said first internal circuit and outputting a second signal to said second internal circuit, and a second transmission portion receiving a third signal from said second internal circuit and outputting a fourth signal to said first internal circuit.

* * * * *